United States Patent
Sakui

(10) Patent No.: US 9,053,797 B2
(45) Date of Patent: Jun. 9, 2015

(54) INHIBITING PILLARS IN 3D MEMORY DEVICES

(71) Applicant: Micron Technology, Inc., Boise, ID (US)

(72) Inventor: Koji Sakui, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 51 days.

(21) Appl. No.: 13/869,710

(22) Filed: Apr. 24, 2013

(65) Prior Publication Data

US 2014/0321215 A1    Oct. 30, 2014

(51) Int. Cl.
 *G11C 16/12* (2006.01)

(52) U.S. Cl.
 CPC ........................ *G11C 16/12* (2013.01)

(58) Field of Classification Search
None
See application file for complete search history.

(56) References Cited

U.S. PATENT DOCUMENTS

| | | | | |
|---|---|---|---|---|
| 2009/0290429 A1* | 11/2009 | Dong et al. | ............... | 365/185.25 |
| 2011/0019486 A1* | 1/2011 | Jang et al. | ................ | 365/185.25 |
| 2012/0051137 A1* | 3/2012 | Hung et al. | ............... | 365/185.17 |
| 2013/0250697 A1* | 9/2013 | Park | ......................... | 365/185.25 |

* cited by examiner

*Primary Examiner* — James G Norman
(74) *Attorney, Agent, or Firm* — Dicke, Billig & Czaja, PLLC

(57) ABSTRACT

Methods and controllers for programming a memory are provided. In one such method, a potential for pillars of the memory that are to be inhibited is lowered, and programming cells of the memory is accomplished while the pillars of the memory that are to be inhibited have the lower potential.

29 Claims, 10 Drawing Sheets

INHIBITING PILLARS IN 3D MEMORY DEVICES

TECHNICAL FIELD

The present embodiments relate generally to memory devices and a particular embodiment relates to inhibiting pillars in memory devices.

BACKGROUND

Memory devices (which are sometimes referred to herein as "memories") are typically provided as internal, semiconductor, integrated circuits in computers or other electronic systems. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Common electronic systems that utilize flash memory devices include, but are not limited to, personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a string of memory cells is coupled in parallel with each memory cell coupled to a data line, such as those typically referred to as digit (e.g., bit) lines. In NAND flash architecture, a string of memory cells is coupled in series with only the first memory cell of the string coupled to a bit line.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory.

Typically, an array of memory cells for NAND flash memory devices is arranged such that the control gate of each memory cell of a row of the array is connected together to form an access line, such as a word line. Columns of the array include strings (often termed NAND strings) of memory cells connected together in series between a pair of select devices, e.g., a source select transistor and a drain select transistor. Each source select transistor is connected to a source, while each drain select transistor is connected to a data line, such as column bit line. A "column" refers to a group of memory cells that are commonly coupled to a local data line, such as a local bit line. It does not require any particular orientation or linear relationship, but instead refers to the logical relationship between memory cell and data line.

To meet the demand for even higher capacity memories, designers continue to strive for increasing memory density, i.e., the number of memory cells for a given area of an integrated circuit die. One way to increase the density of memory devices is to form stacked memory arrays, e.g., often referred to as three-dimensional memory arrays. For example, one type of three-dimensional memory array may include stacked memory cells, e.g., substantially vertical strings of series coupled memory cells, such as substantially vertical NAND strings, corresponding to pillars, such as substantially vertical semiconductor pillars. For example, the memory cells at a common location (e.g., at a common vertical elevation) in the strings may form a tier of memory cells that may be commonly coupled to a common control gate. When many memory cells in a string are programmed to high threshold voltages, inhibiting programming of memory cells corresponding to the pillar during a programming operation can become difficult.

For the reasons stated above and for other reasons that will become apparent to those skilled in the art upon reading and understanding the present specification, there is a need in the art for boosting inhibit efficiency in memories.

DETAILED DESCRIPTION

Figure 1:
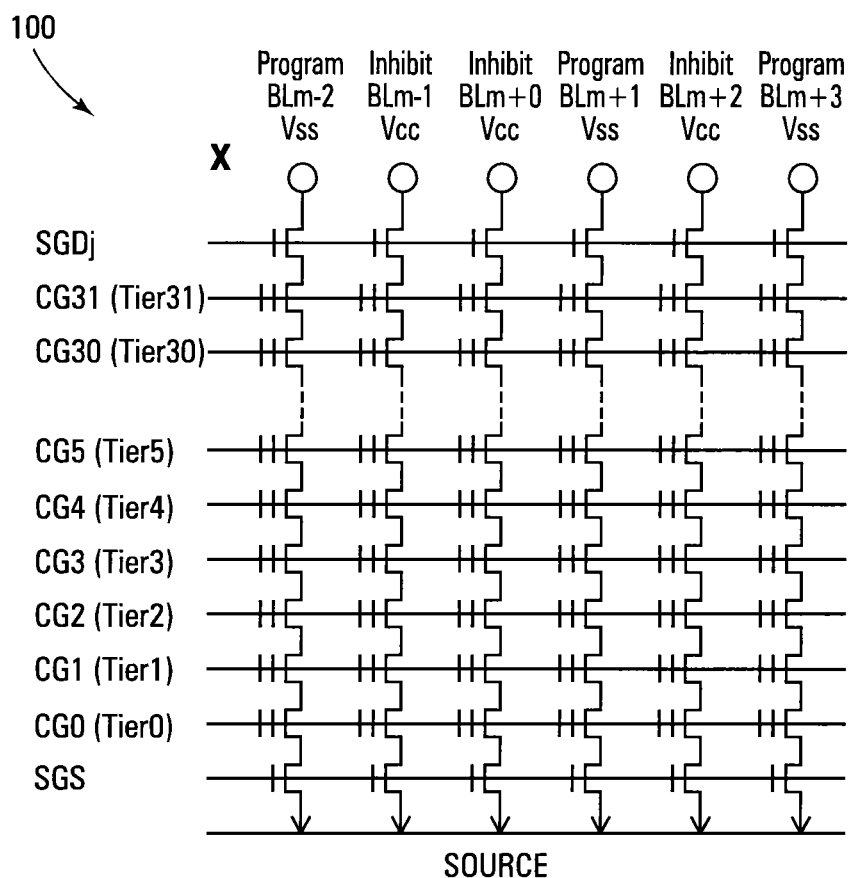
FIG. 1 is a circuit diagram of a memory on which embodiments of the disclosure may be practiced.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 2:
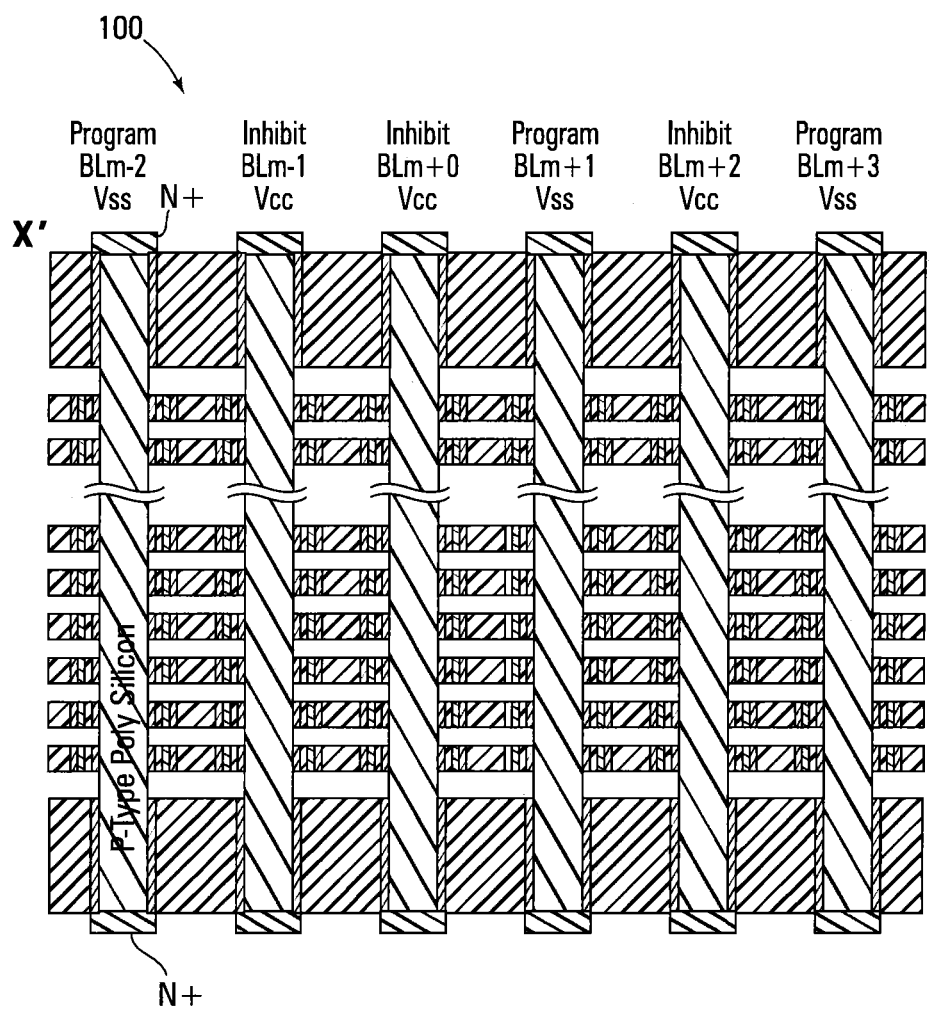
FIG. 2 is a cross-sectional view of the memory of FIG. 1.

FIGS. 1 and 2 show, respectively, a circuit diagram and a cross-sectional view of a memory, such as a 3D NAND memory 100. In typical programming of such a 3D NAND 100, a pillar having cells that are to be programmed has a program enable voltage (e.g., a reference voltage, such as Vss) applied to its data line (typically referred to as a bit line), and the voltage applied thereto biases the pillar to the program enable voltage. An inhibit voltage Vcc is applied to the bit lines of those pillars having cells that are already programmed to inhibit further programming of those cells. The voltage applied thereto biases the pillar to the inhibit voltage.

In a 3D NAND with, for example, 32 tiers of control gates in each block, programming of cells is performed from tier 0, nearest the source, to tier 31, nearest the bit line. In a scenario where each of the memory cells corresponding to a pillar are programmed to a data state corresponding to a relatively high threshold voltage, the channel boosting efficiency of the pillar might be lowered.

Figure 3:
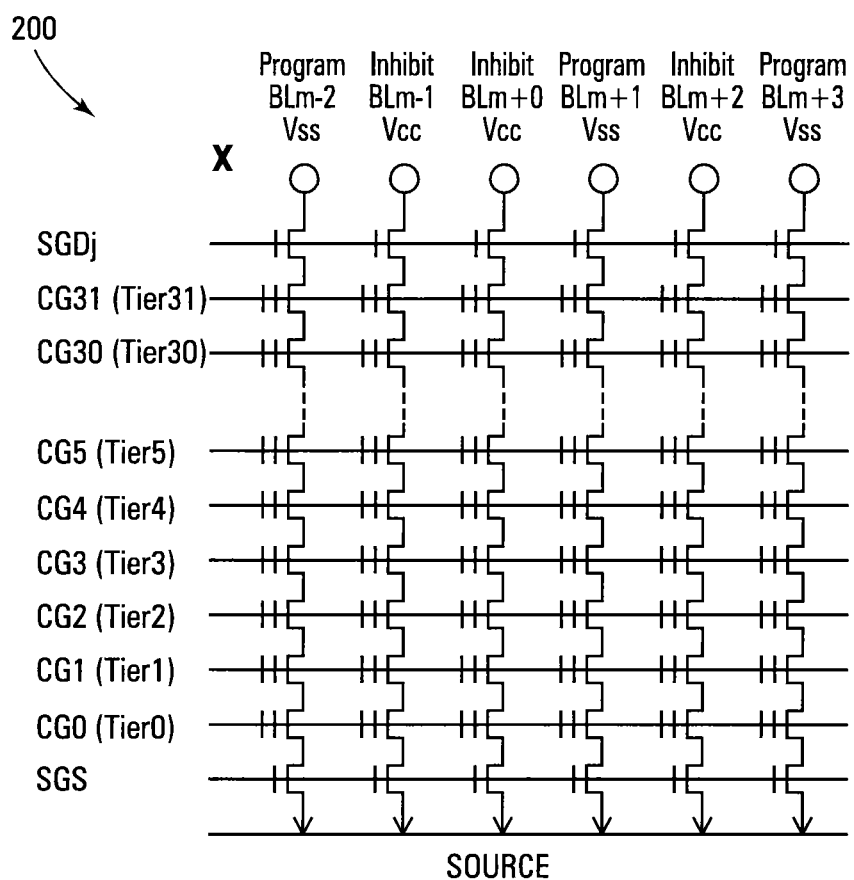
FIG. 3 is a circuit diagram showing voltages on a memory according to an embodiment of the present disclosure.
Figure 4:
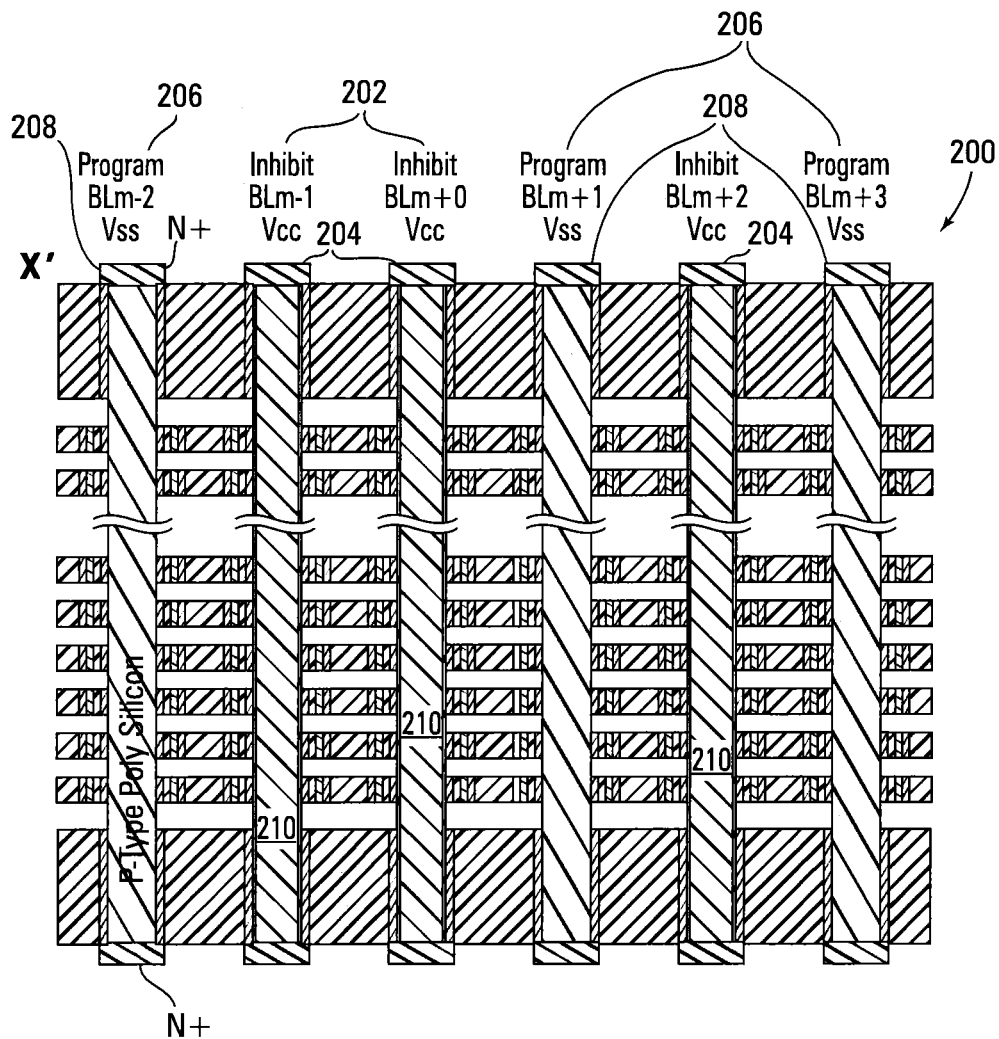
FIG. 4 is a cross-sectional view of the memory of FIG. 3.

One embodiment of boosting the effectiveness of inhibiting is shown in FIGS. 3 and 4. FIGS. 3 and 4 show, respectively, a circuit diagram and a cross-sectional view of a memory, such as a 3D NAND memory 200, on which embodiments of the present disclosure may be practiced. The methods by which the present disclosure increases the voltage on the pillars that are to be inhibited is discussed further below.

In FIG. 4, the pillars 202 corresponding to memory cells to be inhibited from programming are shown with an inhibit voltage Vcc on the bit lines 204. The pillars 206 corresponding to memory cells to be enabled for programming are shown with a program enable voltage Vss on the bit lines 208. A programming operation using a boosted effective inhibit scheme is shown in timing diagram form in FIG. 5.

Boosting the effectiveness of the inhibit voltage in one embodiment comprises increasing the voltage of the pillars 210 corresponding to memory cells to be inhibited from programming. This is accomplished in one embodiment by creating a gate induced drain leakage (GIDL) current on those pillars 210 that are to be inhibited. The GIDL current increases the voltage on the inhibited pillars by an amount Vpillar that in one embodiment is approximately one volt. GIDL is induced in one embodiment by lowering voltage on a gate of a drain select transistor of the memory from a reference voltage (e.g., a ground voltage) to a voltage below a reference voltage.

Figure 5:
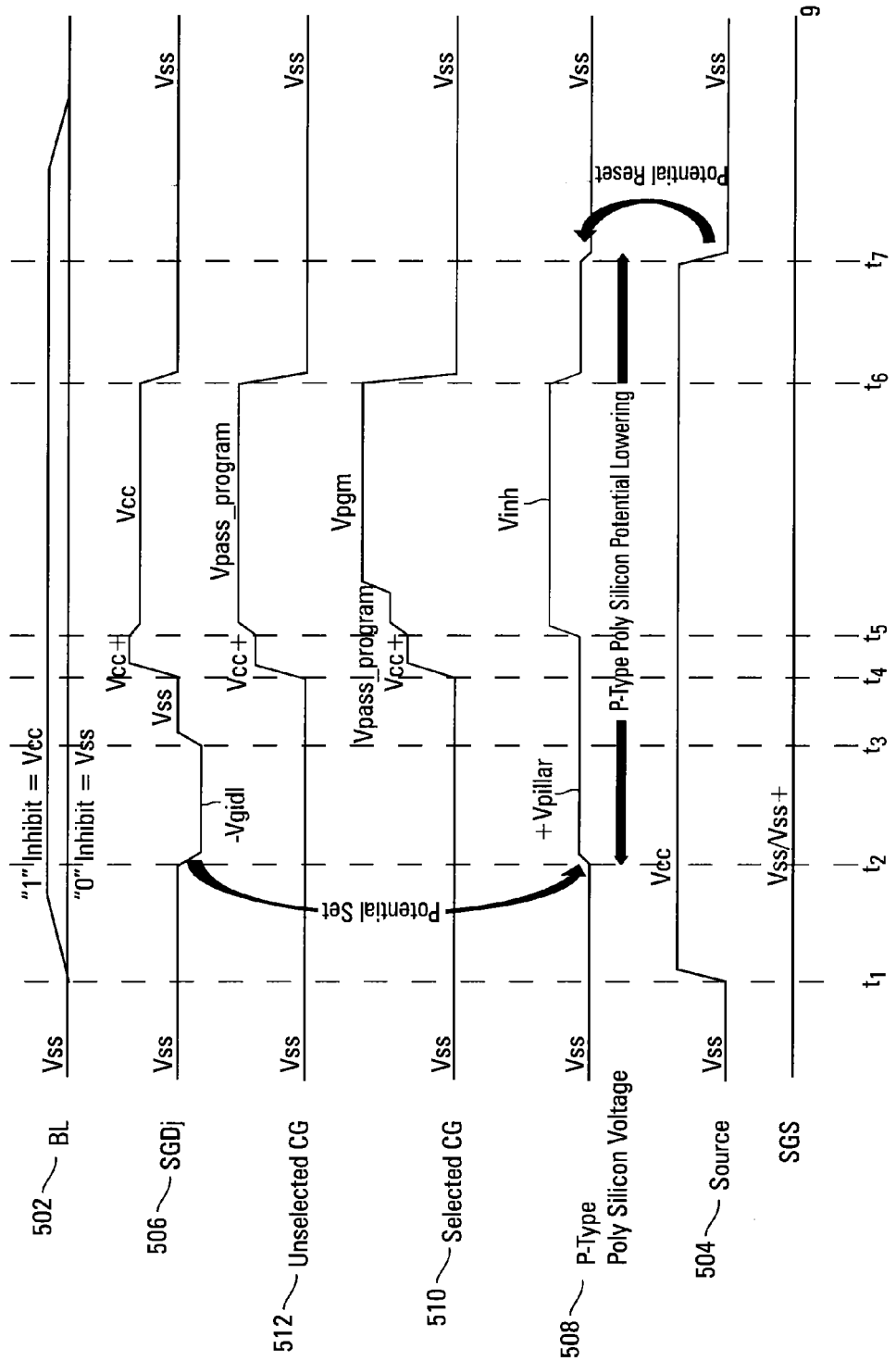
FIG. 5 is a timing diagram for one embodiment of programming with increased pillar voltage.

A timing diagram for programming with increased pillar voltage due to GIDL is shown in FIG. 5. At some point in a programming operation for a 3D memory, some pillars of the memory will have cells that are inhibited, and some will have cells that are to be programmed. Pillars that are to be inhibited are initially biased with a bit line inhibit voltage, in one embodiment Vcc, and pillars that are to be programmed are initially biased with a bit line program voltage, in one embodiment voltage Vss, as shown at 502. At time t1, the source 504 is raised from a reference voltage (e.g., Vss) to a supply voltage (e.g., Vcc). At the same time t1, bit lines coupled to pillars (through respective drain select devices) to be inhibited are biased to the supply voltage (Vcc). At time t2, before programming pulses begin, the drain select transistor gate voltage 506 is dropped from the reference voltage to a voltage sufficient to induce GIDL at the drain select transistors corresponding to pillars to be inhibited, thereby increasing a voltage on the pillars to be inhibited (e.g., to +Vpillar), as has been described above. For example, this increases a voltage 508 on pillars to be inhibited from the reference voltage Vss by an amount Vpillar, which in one embodiment is approximately one volt. This pillar voltage increase serves, as has been discussed, to lower the threshold voltages of cells corresponding to the inhibited pillars so that the cells are easier to inhibit.

Once the pillar voltage has been increased, the GIDL is stopped at time t3, and boosting of the pillar voltage may begin. At time t4, drain select gate voltage 506, and the voltages of selected 510 and unselected 512 control gates are raised to a voltage Vcc+, which in one embodiment is greater that the supply voltage. The drain select gate voltage subsequently drops to the supply voltage and a voltage Vpass_program, which in one embodiment is greater than Vcc+ but less than Vpgm, is applied to the control gates of memory cells coupled to the pillars, wherein the voltage on the pillar is then boosted from +Vpillar to an inhibit voltage Vinh at time t5, prior to a program pulse being applied to a selected control gate (coupled to both a memory cell enabled for programming and a memory cell to be inhibited from programming, which respectively correspond to different pillars). At time t6, programming is complete, and voltages 506, 510, and 512 drop to the reference voltage, and at time t7, the potential for the inhibited pillars 508 is reset by dropping the source voltage back to the reference voltage.

Boosting the effectiveness of the inhibit voltage in another embodiment comprises increasing the voltage of the pillars 210 to be inhibited by creating impact ionization on the pillars that are to be inhibited. Impact ionization is created in one embodiment by increasing voltage on a drain select gate corresponding to a pillar to be inhibited from a reference voltage to approximately half of a supply voltage. The impact ionization increases the voltage on the inhibited pillars by an amount Vpillar that in one embodiment is approximately one volt.

Figure 6:
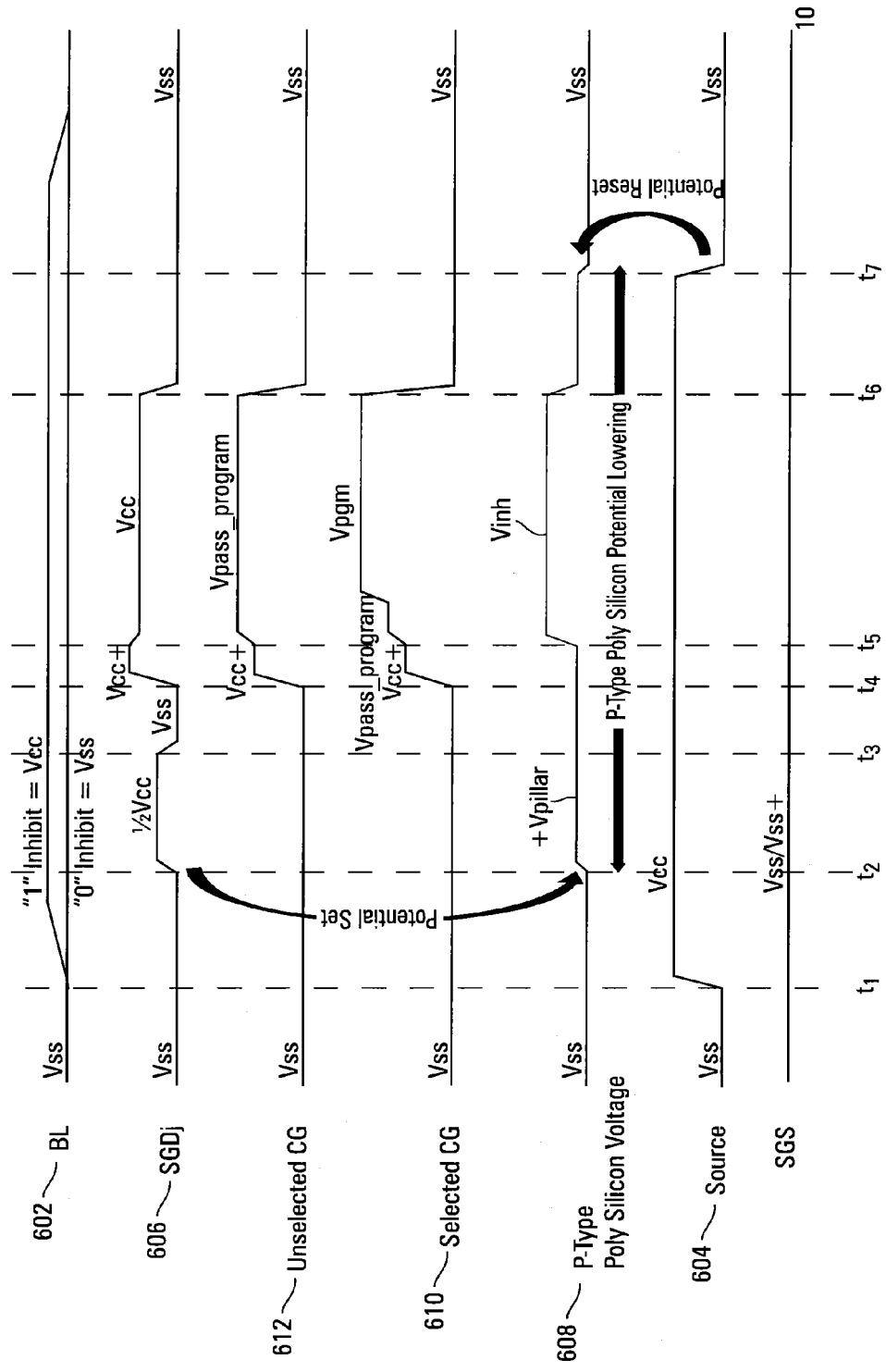
FIG. 6 is a timing diagram for another embodiment of programming with increased pillar voltage.

A timing diagram for programming with increased pillar voltage due to impact ionization is shown in FIG. 6. At some point in a programming operation for a 3D memory, some pillars of the memory will have cells that are inhibited, and some will have cells that are to be programmed. Pillars that are to be inhibited are initially biased with a bit line inhibit voltage, in one embodiment Vcc, and pillars that are to be programmed are initially biased with a bit line program voltage, in one embodiment voltage Vss, as shown at 602. At time t1, the source 604 is raised from a reference voltage (e.g., Vss) to a supply voltage (e.g., Vcc). At the same time t1, bit lines coupled to pillars (through respective drain select devices) to be inhibited are biased to the supply voltage (Vcc). At time t2, before programming pulses begin, the drain select gate voltage 606 is raised from the reference voltage to a voltage sufficient to induce impact ionization, as has been described above. This in turn increases pillar voltage 608 from the reference voltage Vss (e.g., to +Vpillar), which in one embodiment is approximately one volt. This pillar voltage increase serves, as has been discussed, to lower the threshold voltages of cells corresponding to the inhibited pillars so that the cells are easier to inhibit.

Once the pillar voltage has been increased, the impact ionization is stopped at time t3, and boosting of the pillar voltage may begin. At time t4, drain select gate voltage 606, and the voltages of selected 610 and unselected 612 control gates are raised to a voltage Vcc+, which in one embodiment is greater that the supply voltage. The drain select gate voltage subsequently drops to the supply voltage and a voltage Vpass_program, which in one embodiment is greater than Vcc+ but less than Vpgm, is applied to the control gates of memory cells coupled to the pillars, wherein the voltage on the pillar is then boosted from +Vpillar to an inhibit voltage Vinh at time t5, prior to a program pulse being applied to a selected control gate (coupled to both a memory cell enabled for programming and a memory cell to be inhibited from programming, which respectively correspond to different pillars). At time t6, programming is complete, and voltages 606, 610, and 612 drop to the reference voltage, and at time t7, the potential for the inhibited pillars 608 is reset by dropping the source voltage back to the reference voltage.

In each of these processes, the pillar potentials are lowered, and therefore, inhibiting those pillars that are to be inhibited is more efficiently performed, as the higher pillar voltage creates lower potential difference between the threshold voltage of the cells and the inhibit voltage, allowing for a stronger inhibit operation.

Figure 7:
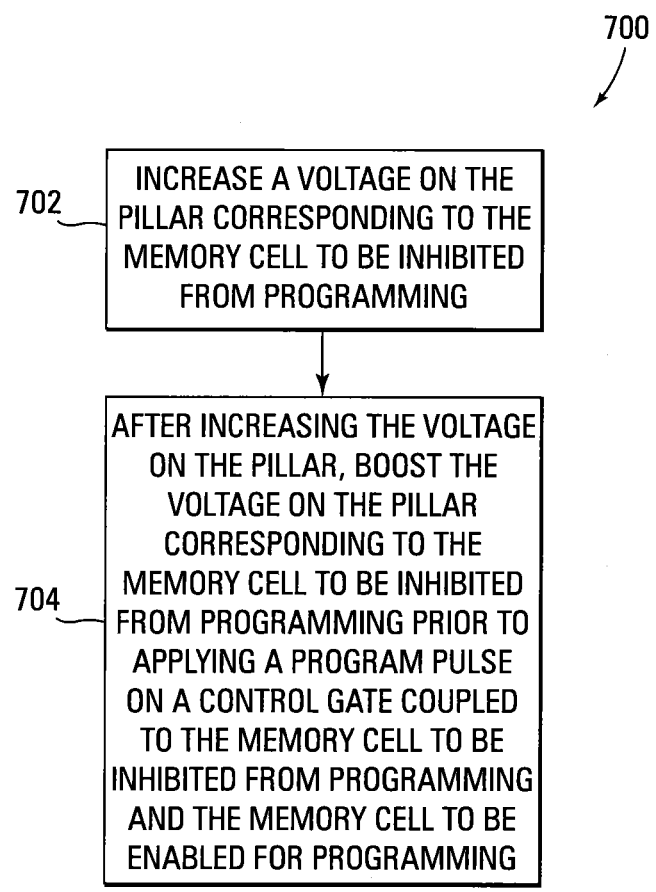
FIG. 7 is a flow chart diagram of a method according to an embodiment of the disclosure.

A method 700 of operating a three-dimensional memory is shown in flow chart form in FIG. 7. Method 700 comprises increasing a voltage on the pillar corresponding to the memory cell to be inhibited from programming in block 702, and after increasing the voltage on the pillar, boosting the voltage on the pillar corresponding to the memory cell to be inhibited from programming prior to applying a program pulse on a control gate coupled to the memory cell to be inhibited from programming and the memory cell to be enabled for programming 704. In one embodiment, the voltage on the pillar corresponding to the memory cell to be inhibited from programming is increased without increasing a voltage on a pillar corresponding to a memory cell to be enabled for programming. Increasing a voltage comprises in one embodiment increasing a voltage from a reference voltage (e.g., Vss) to a +Vpillar voltage. Boosting the voltage in one embodiment comprises boosting the voltage from the +Vpillar voltage to an inhibit voltage (Vinh). The potential for pillars following a programming operation is reset in block 706. As has been described above, increasing a voltage is accomplished, for example, by generating gate induced drain leakage (GIDL) current at a select device corresponding to the pillar corresponding to the memory cell to be inhibited from programming, or by creating impact ionization on the pillars that are to be inhibited.

Figure 8:
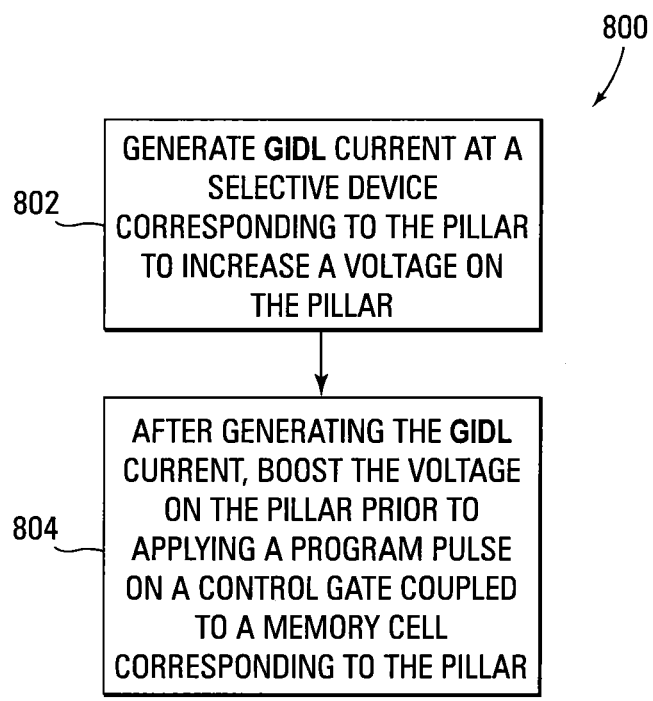
FIG. 8 is a flow chart diagram of a method according to another embodiment of the disclosure.

A method 800 of inhibiting programming of a memory cell corresponding to a pillar of semiconductor material is shown in flow chart form in FIG. 8. Method 800 comprises generating GIDL current at a select device corresponding to the pillar to increase a voltage on the pillar in block 802, and after generating the GIDL current, boosting the voltage on the pillar prior to applying a program pulse on a control gate coupled to a memory cell corresponding to the pillar in block 802. Boosting the voltage comprises, in one embodiment, applying a Vpass_program voltage to control gates of the memory cells corresponding to the pillar. In one embodiment, a voltage Vcc+ is applied to the control gates before Vpass_program is applied. Generating GIDL current in one embodiment comprises biasing a data line coupled to the pillar through the select device to a supply voltage (e.g., Vcc), and biasing a control gate of the select device to a −Vgidl voltage. In another embodiment, generating GIDL current comprises increasing the voltage on the pillar from a reference voltage (e.g., Vss) to a +Vpillar voltage, and boosting the voltage on the pillar comprises boosting the voltage from the +Vpillar voltage to an inhibit voltage Vinh.

Figure 9:
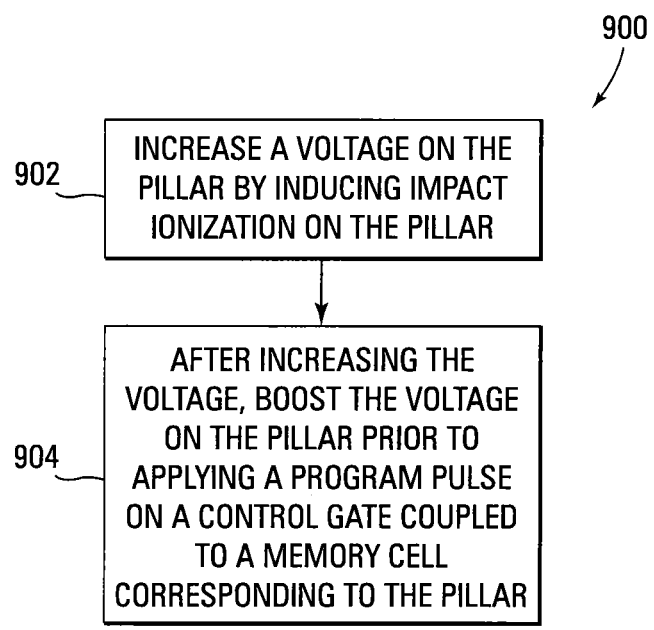
FIG. 9 is a flow chart diagram of a method according to yet another embodiment of the disclosure.

A method 900 of inhibiting programming of a memory cell corresponding to a pillar of semiconductor material is shown in FIG. 9. Method 900 comprises increasing a voltage on the pillar by inducing impact ionization on the pillar in block 902, and after increasing the voltage, boosting the voltage on the pillar prior to applying a program pulse on a control gate coupled to the memory cell corresponding to the pillar in block 904. Increasing a voltage on the pillar using impact ionization in one embodiment comprises biasing a data line coupled to the pillar through a select device to a supply voltage (e.g., Vcc), and biasing a control gate of the select device to approximately ½ of the supply voltage. In another embodiment, increasing a voltage on the pillar comprises increasing the voltage from a reference voltage (e.g., Vss) to a +Vpillar voltage, and boosting the voltage on the pillar comprises boosting the voltage from the +Vpillar voltage to an inhibit voltage Vinh.

Increasing the voltage on the pillar in the methods of FIGS. 7, 8, and 9 lowers a threshold voltage of the memory cell to be inhibited from programming. Further, increasing the voltage on the pillar in another embodiment in the methods of FIGS. 7, 8, and 9 lowers threshold voltages of a plurality of memory cells corresponding to the pillar. Also, increasing the voltage on the pillar in the methods of FIGS. 7, 8, and 9 increases channel boosting efficiency of the pillar. Boosting the voltage on the pillar in the methods of FIGS. 7, 8, and 9 after increasing the voltage on the pillar boosts the voltage higher than if the voltage on the pillar was boosted without first increasing the voltage on the pillar.

Figure 10:
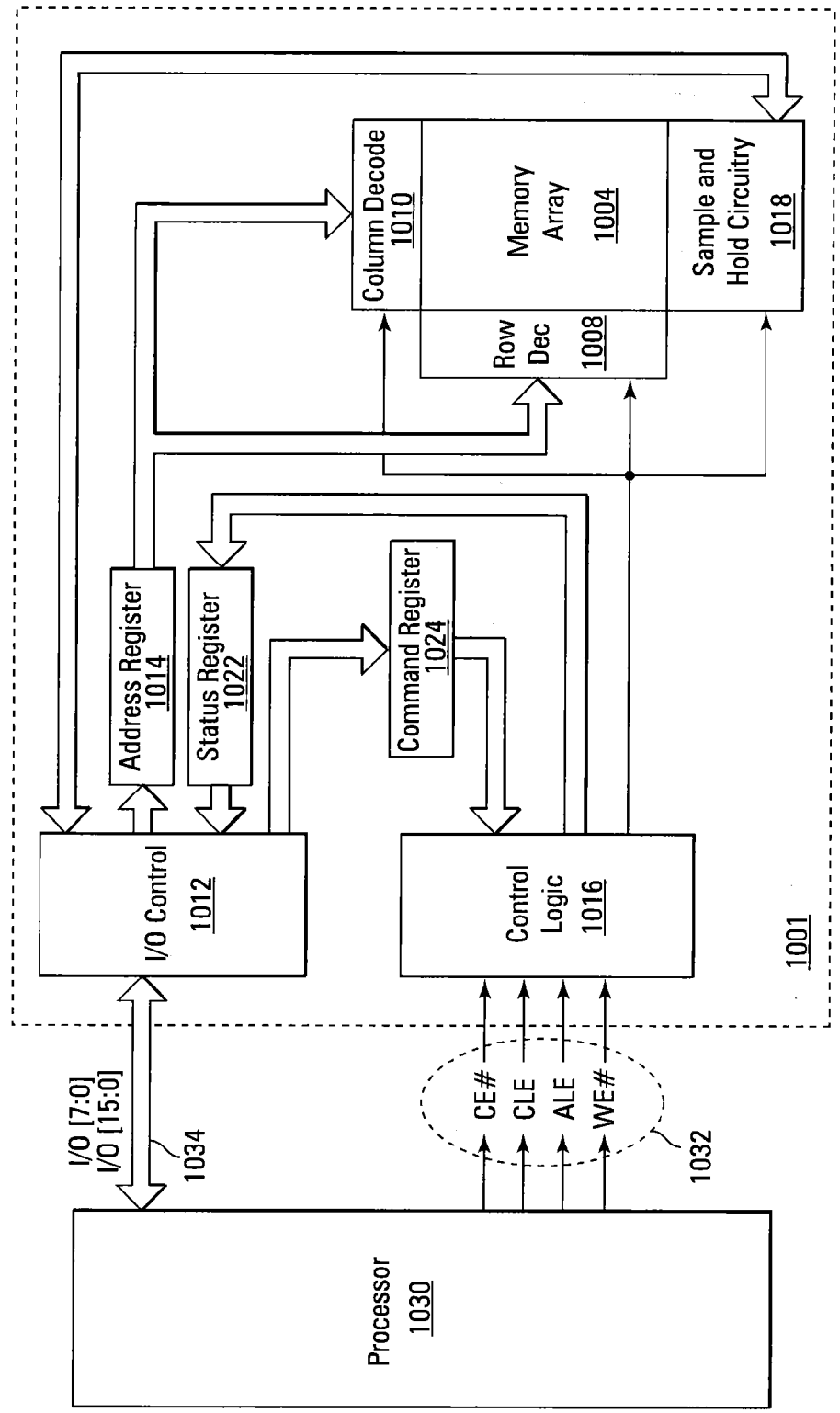
FIG. 10 is a block schematic of an electronic system in accordance with an embodiment of the disclosure.

FIG. 10 is a simplified block diagram of a memory device 1001 according to an embodiment of the disclosure, and on which various embodiments of the disclosure can be practiced. Memory device 1001 includes an array of memory cells 1004 arranged in rows and columns. Although the various embodiments will be described primarily with reference to NAND memory arrays, the various embodiments are not limited to a specific architecture of the memory array 1004. Some examples of other array architectures suitable for the present embodiments include NOR arrays, AND arrays, and virtual ground arrays. Further, the embodiments described herein are amenable for use with SLC and MLC memories without departing from the scope of the disclosure. Also, the methods are applicable for memories which could be read/sensed in analog format.

Row decode circuitry 1008 and column decode circuitry 1010 are provided to decode address signals provided to the memory device 1001. Address signals are received and decoded to access memory array 1004. Memory device 1001 also includes input/output (I/O) control circuitry 1012 to manage input of commands, addresses and data to the memory device 1001 as well as output of data and status information from the memory device 1001. An address register 1014 is coupled between I/O control circuitry 1012 and row decode circuitry 1008 and column decode circuitry 1010 to latch the address signals prior to decoding. A command register 1024 is coupled between I/O control circuitry 1012 and control logic 1016 (which may include the elements and code of controller 1030) to latch incoming commands. In one embodiment, control logic 1016, I/O control circuitry 1012 and/or firmware or other circuitry can individually, in combination, or in combination with other elements, form an internal controller. As used herein, however, a controller need not necessarily include any or all of such components. In some embodiments, a controller can comprise an internal controller (e.g., located on the same die as the memory array) and/or an external controller. Control logic 1016 controls access to the memory array 1004 in response to the commands and generates status information for an external controller such as a processor 1030. The control logic 1016 is coupled to row decode circuitry 1008 and column decode circuitry 1010 to control the row decode circuitry 1008 and column decode circuitry 1010 in response to the addresses.

A status register 1022 is coupled between I/O control circuitry 1012 and control logic 1016 to latch the status information for output to an external controller.

Memory device 1001 receives control signals at control logic 1016 over a control link 1032. The control signals may include a chip enable CE#, a command latch enable CLE, an address latch enable ALE, and a write enable WE#. Memory device 1001 may receive commands (in the form of command signals), addresses (in the form of address signals), and data (in the form of data signals) from an external controller over a multiplexed input/output (I/O) bus 1034 and output data to an external controller over I/O bus 1034.

In a specific example, commands are received over input/output (I/O) pins [7:0] of I/O bus 1034 at I/O control circuitry 1012 and are written into command register 1024. The addresses are received over input/output (I/O) pins [7:0] of bus 1034 at I/O control circuitry 1012 and are written into address register 1014. The data may be received over input/ output (I/O) pins [7:0] for a device capable of receiving eight parallel signals, or input/output (I/O) pins [15:0] for a device capable of receiving sixteen parallel signals, at I/O control circuitry 1012 and are transferred to data register and cache register 1018. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 10 has been simplified to help focus on the embodiments of the disclosure.

Methods for programming may be performed in various embodiments on a memory such as memory device 1001. Such methods are shown and described herein with reference to FIGS. 3-7.

Additionally, while the memory device of FIG. 10 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 1034. Because the data signals represent bit patterns instead of individual bits, serial communication of an 8-bit data signal could be as efficient as parallel communication of eight signals representing individual bits.

CONCLUSION

In summary, one or more embodiments of the disclosure show boosting efficiency of inhibit schemes in memory programming for three dimensional memories. Voltages of pillars to be inhibited are increased prior to boosting by gate induced drain leakage or impact ionization.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of inhibiting programming of a memory cell corresponding to a pillar of semiconductor material, comprising:
    increasing a voltage on the pillar corresponding to the memory cell to be inhibited from programming without increasing a voltage on a pillar corresponding to a memory cell to be enabled for programming; and
    after increasing the voltage on the pillar, boosting the voltage on the pillar corresponding to the memory cell to be inhibited from programming prior to applying a program pulse on a control gate coupled to the memory cell to be inhibited from programming and the memory cell to be enabled for programming;
    wherein increasing the voltage on the pillar comprises decreasing a voltage on a select device corresponding to the pillar corresponding to the memory cell to be inhibited from programming from a first voltage to a second voltage while a data line coupled to the select device is at an inhibit voltage.

2. The method of claim 1, wherein increasing a voltage comprises increasing a voltage from a reference voltage (Vss) to a +Vpillar voltage.

3. The method of claim 2, wherein boosting the voltage comprises boosting the voltage from the +Vpillar voltage to an inhibit voltage.

4. The method of claim 1, wherein increasing the voltage on the pillar lowers a threshold voltage of the memory cell to be inhibited from programming.

5. The method of claim 1, wherein increasing the voltage on the pillar increases channel boosting efficiency of the pillar.

6. The method of claim 1, wherein boosting the voltage on the pillar after increasing the voltage on the pillar boosts the voltage higher than if the voltage on the pillar was boosted without first increasing the voltage on the pillar.

7. The method of claim 1, wherein select device is a drain select transistor.

8. A method of inhibiting programming of a memory cell corresponding to a pillar of semiconductor material, comprising:
    increasing a voltage on the pillar corresponding to the memory cell to be inhibited from programming without increasing a voltage on a pillar corresponding to a memory cell to be enabled for programming; and
    after increasing the voltage on the pillar, boosting the voltage on the pillar corresponding to the memory cell to be inhibited from programming prior to applying a program pulse on a control gate coupled to the memory cell to be inhibited from programming and the memory cell to be enabled for programming;
    wherein increasing a voltage on the pillar comprises generating GIDL current at a select device corresponding to the pillar corresponding to the memory cell to be inhibited from programming.

9. A method of inhibiting programming of a memory cell corresponding to a pillar of semiconductor material, comprising:
    generating gate induced drain leakage (GIDL) current at a select device corresponding to the pillar to increase a voltage on the pillar; and
    after generating the GIDL current, boosting the voltage on the pillar prior to applying a program pulse on a control gate coupled to a memory cell corresponding to the pillar.

10. The method of claim 9, wherein boosting the voltage on the pillar comprises applying a Vpass_program voltage to control gates of the memory cells corresponding to the pillar.

11. The method of claim 10, wherein boosting the voltage on the pillar further comprises applying a voltage Vcc+ to the control gates before applying Vpass_program.

12. The method of claim 9, wherein increasing the voltage on the pillar lowers a threshold voltage of the memory cell to be inhibited from programming.

13. The method of claim 9, wherein increasing the voltage on the pillar increases channel boosting efficiency of the pillar.

14. The method of claim 9, wherein boosting the voltage on the pillar after increasing the voltage on the pillar boosts the voltage higher than if the voltage on the pillar was boosted without first increasing the voltage on the pillar.

15. The method of claim 9, wherein generating GIDL current comprises:
    biasing a data line coupled to the pillar through the select device to a supply voltage (Vcc); and
    biasing a control gate of the select device to a −Vgidl voltage.

16. The method of claim 9, generating GIDL current at a select device comprises increasing the voltage on the pillar from a reference voltage to a +Vpillar voltage and wherein boosting the voltage on the pillar comprises boosting the voltage from the +Vpillar voltage to an inhibit voltage.

17. A method of inhibiting programming of a memory cell corresponding to a pillar of semiconductor material, comprising:
increasing a voltage on the pillar by impact ionization; and
after increasing the voltage, boosting the voltage on the pillar prior to applying a program pulse on a control gate coupled to a memory cell corresponding to the pillar;
wherein increasing the voltage on the pillar by impact ionization comprises increasing a voltage on a select device corresponding to the pillar from a first voltage to a second voltage while a data line coupled to the select device is at an inhibit voltage; and
wherein the voltage on the select device corresponding to the pillar is decreased from the second voltage to the first voltage and increased from the first voltage to a third voltage greater than the second voltage before boosting the voltage on the pillar.

18. The method of claim 17, wherein the inhibit voltage is a supply voltage and the second voltage is ½ the supply voltage.

19. The method of claim 17, wherein increasing a voltage on the pillar comprises increasing the voltage from a reference voltage to a +Vpillar voltage and wherein boosting the voltage on the pillar comprises boosting the voltage from the +Vpillar voltage to an inhibit voltage.

20. The method of claim 17, wherein increasing the voltage on the pillar lowers a threshold voltage of the memory cell to be inhibited from programming.

21. The method of claim 17, wherein increasing the voltage on the pillar increases channel boosting efficiency of the pillar.

22. The method of claim 17, wherein boosting the voltage on the pillar after increasing the voltage on the pillar boosts the voltage higher than if the voltage on the pillar was boosted without first increasing the voltage on the pillar.

23. The method of claim 17, wherein third voltage is greater than the inhibit voltage.

24. A memory device, comprising:
an array of memory cells; and
a controller, the controller adapted to perform a method comprising:
increasing a voltage on the pillar corresponding to the memory cell to be inhibited from programming without increasing a voltage on a pillar corresponding to a memory cell to be enabled for programming; and
after increasing the voltage on the pillar, boosting the voltage on the pillar corresponding to the memory cell to be inhibited from programming prior to applying a program pulse on a control gate coupled to the memory cell to be inhibited from programming and the memory cell to be enabled for programming;
wherein increasing the voltage on the pillar comprises decreasing a voltage on a select device corresponding to the pillar corresponding to the memory cell to be inhibited from programming from a first voltage to a second voltage while a data line coupled to the select device is at an inhibit voltage.

25. The memory device of claim 24, wherein the controller is further adapted to increase a voltage comprises increasing a voltage from a reference voltage (Vss) to a +Vpillar voltage.

26. The memory device of claim 25, wherein boosting the voltage comprises boosting the voltage from the +Vpillar voltage to an inhibit voltage.

27. A memory device, comprising:
an array of memory cells; and
a controller, the controller adapted to perform a method comprising:
increasing a voltage on the pillar corresponding to the memory cell to be inhibited from programming without increasing a voltage on a pillar corresponding to a memory cell to be enabled for programming; and
after increasing the voltage on the pillar, boosting the voltage on the pillar corresponding to the memory cell to be inhibited from programming prior to applying a program pulse on a control gate coupled to the memory cell to be inhibited from programming and the memory cell to be enabled for programming;
wherein the controller is further adapted to increase a voltage on the pillar by generating GIDL current at a select device corresponding to the pillar corresponding to the memory cell to be inhibited from programming.

28. A memory device, comprising:
an array of memory cells; and
a controller, the controller adapted to perform a method comprising:
generating gate induced drain leakage (GIDL) current at a select device corresponding to the pillar to increase a voltage on the pillar; and
after generating the GIDL current, boosting the voltage on the pillar prior to applying a program pulse on a control gate coupled to a memory cell corresponding to the pillar.

29. A memory device comprising:
an array of memory cells; and
a controller, the controller adapted to perform a method comprising:
increasing a voltage on the pillar by impact ionization; and
after increasing the voltage, boosting the voltage on the pillar prior to applying a program pulse on a control gate coupled to a memory cell corresponding to the pillar;
wherein increasing the voltage on the pillar by impact ionization comprises increasing a voltage on a select device corresponding to the pillar from a first voltage to a second voltage while a data line coupled to the select device is at an inhibit voltage; and
wherein the voltage on the select device corresponding to the pillar is decreased from the second voltage to the first voltage and increased from the first voltage to a third voltage greater than the second voltage before boosting the voltage on the pillar.

* * * * *